United States Patent [19]

Gautschi

[11] Patent Number: 4,656,440
[45] Date of Patent: Apr. 7, 1987

[54] SINGLE-SIDEBAND MODULATOR AND BROADCAST TRANSMITTER

[75] Inventor: Max Gautschi, Zürich, Switzerland

[73] Assignee: BBC Brown, Boveri & Company, Limited, Baden, Switzerland

[21] Appl. No.: 824,091

[22] Filed: Jan. 30, 1986

[30] Foreign Application Priority Data

Feb. 14, 1985 [CH] Switzerland ............... 671/85

[51] Int. Cl.$^4$ ............................................. H03C 1/60
[52] U.S. Cl. ................................. 332/45; 332/48; 332/49; 332/60; 332/64; 455/47; 455/109
[58] Field of Search ............... 332/45, 48, 49, 60–67; 455/47, 109

[56] References Cited

U.S. PATENT DOCUMENTS 4,417,358 11/1983 Zeis ........................... 455/109
4,593,410 6/1986 Kyrian ....................... 332/45 X

OTHER PUBLICATIONS

Kocher et al., "A New 500 kW Short-Wave Transmitter", Brown Boveri Review 5/6, 1983, pp. 235–240.
Münger et al., "A New 600 kW Medium-Wave Transmitter", Brown Boveri Review 5, 1984, pp. 202–205.
Nohara et al., "Generation of Single-Sideband Signal Using Switched-Mode Technique", Bull. Univ. Osaka Prefect. A. (Japan), vol. 23, No. 2, 1974, pp. 167–176.

Primary Examiner—Siegfried H. Grimm
Attorney, Agent, or Firm—Oblon, Fisher, Spivak, McClelland & Maier

[57] ABSTRACT

A broadcast transmitter with single-sideband modulation for transmitting a message with a band width and carrier power which is lower in comparison with double-sideband modulation. To be able to operate a high-power single-sideband transmitter with only one transmitting tube, a single-sideband modulator (1) is used which generates, as a function on a modulating LF signal (2), a zero-phase modulator amplitude signal (9) which amplitude-modulates the anode (23) of an RF output stage tube (26) via a digital/analog converter (21), constructed as a switching amplifier with pulse step modulation, and an RF filter (22). The single-sideband modulator (1) also supplies a modulator phase signal (19) which is preferably not amplitude-dependent and which is fed to the control grid of the RF output stage tube (26), if necessary via a frequency converter (25). The single-sideband modulator (1) can be of digital or analog construction; at its input it has a Hilbert transformer which splits the modulating input signal (2) into two component signals which are phase-shifted by 90° and at its output it is also provided with an amplitude computer, a cyclic switch having a clock frequency ($f_T$) which is preferably equal to 4 times the carrier frequency ($f_1$) and, if necessary, a quotient computer and a subsequent band-pass filter. A residual carrier signal can be added to the input signal (2) or to the output signals of the Hilbert transformer.

12 Claims, 3 Drawing Figures

SINGLE-SIDEBAND MODULATOR AND BROADCAST TRANSMITTER

BACKGROUND OF THE INVENTION

1. Field of the Invention

The invention relates generally to a single-sideband modulation method and apparatus and more particularly to a single-sideband modulation method and apparatus using only one transmitting tube.

2. Discussion of the Background

Prior art relating to this invention is described in the German book: H. Meinke and F. W. Gundlach, Taschenbuch der Hochfrequenztechnik (Pocketbook of Radio-Frequency Engineering), Springer-Verlag Berlin/Heidelberg/New York 1968, pages 1323–1325. In this publication, a single-sideband modulator for a large frequency range of the carrier oscillation and a wide low-frequency band according to Lenehan is described, in which modulator phase dividers generating component signals phase-shifted by 90° are provided for both frequency ranges. These component signals feed two ring modulators which, in turn, drive three final amplifier tubes. A disadvantage of this arrangement is that three tubes are needed which must be operated within their linear range, that is to say in class A or class B mode.

SUMMARY OF THE INVENTION

Accordingly, one object of this invention is to provide a novel single-sideband modulation method, a single-sideband modulator and a broadcast transmitter with single-sideband modulation, by means of which it is possible to operate a high-power single-sideband transmitter using only one transmitting tube.

One advantage of the invention lies in the fact that the transmitting tube does not need to be operated within its linear range but can be operated in class C mode with higher anode efficiency with any drive. A further advantage consists in the fact that broadcast transmitters with amplitude modulation can be easily re-equipped and converted to single-sideband techniques, if necessary, by using the single-sideband modulator according to the invention.

By using a modulation switching amplifier with pulse step modulation, a high modulator efficiency and also an improved total efficiency can be achieved in a broadcast transmitter if single-sideband modulation is used. Since the modulation switching amplifier has much lower losses than a comparable modulation tube, a high total transmitter efficiency is obtained. The increased circuit expenditure for the modulation switching amplifier is quickly cancelled out by the lower power consumption. The modulation switching amplifier has less space requirement and lower operating costs since there are no tube replacement costs.

In the case of a broadcast transmitter, the low number of power components and wearing parts, in addition to high efficiency, ensures high availability, low maintenance costs and excellent maintainability.

According to an advantageous development of the invention, it is also possible to send the single-sideband signal together with a carrier signal.

With respect to the relevant state of the art, additional reference is made to the Swiss firm's journal Brown Boveri Mitteilungen 5, 1984, pages 202–205, from which it is known, with respect to a 600 kW medium-wave transmitter, to achieve a high modulator efficiency and also a high total transmitter efficiency with only one high-power RF (radio-frequency) tetrode in the final stage and with a fully transistorised modulation switching amplifier using pulse step modulation in double-sideband technique. In this arrangement, the product of LF (low frequency) signal and radio-frequency carrier, necessary for amplitude modulation, is formed directly in the RF output stage. The radio-frequency carrier is applied with constant amplitude to the grid of the RF output stage. The LF signal used as modulation drives a so-called pulsator, that is to say a modulation switching amplifier with pulse step modulation or a digital/analog converter which is designed to be powerful enough for the transmitting power and which generates the anode voltage in accordance with the instantaneous transmitting power. For explanation of the details of switching amplifier design, reference is made to Brown Boveri Review, 5/6, 1983 pp. 235–240, FIGS. 5 and 6 in particular.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE DRAWINGS

Figure 1:
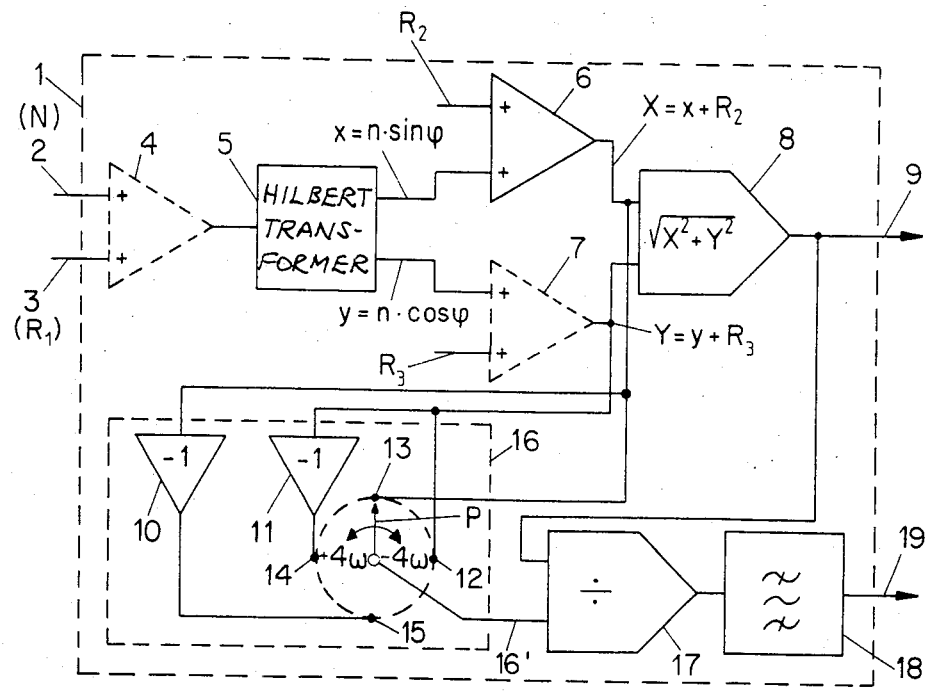
FIG. 1 shows a single-sideband modulator of the present invention.

Various other objects, features and attendant advantages of the present invention will be more fully appreciated as the same becomes better understood from the following detailed description when considered in connection with the accompanying drawings in which like reference characters designate like or corresponding parts throughout the several views and wherein in FIG. 1, 1 designates a single-sideband modulator, 2 a first input for a modulating LF signal or an input signal N(t) which is dependent on time t, and 4 an adder which is supplied with a residual carrier signal $R_1$ via a second input 3.

At its output, the adder 4 is connected to the input of a phase separator or Hilbert transformer 5 which splits an input signal into several component signals which have a fixed phase relationship to each other. In the examples shown, the input signal N is split, without residual carrier signal $R_1$ for the sake of clarity, into two component signals $x(t) = n(t) \cdot \sin(t)$ and $y(t) = n(t) \cdot \cos(t)$ which are phase-shifted by 90° and the sum of which corresponds to the original signal N(t). n(t) is here the peak value and (t) the phase angle of x(t). Hilbert transformers are known from: Electronic Design 19, Sept. 13, 1976, pages 90–94 and AEÜ (Archiv für Elektronik and Uebertragungstechnik—Archive for Electronics and Transmission Technology) 36 (1982) volume 7/8, pages 304–310.

The component signal x is supplied to an adding input of an adder 6 and the component signal y is supplied to an adding input of another adder 7. Another adding input of the adder 6 is supplied with a residual-carrier signal $R_2$ and a second adding input of the adder 7 is supplied with a residual-carrier signal $R_3$.

The residual carrier signals $R_1$, $R_2$, $R_3$ are constant. If the residual carrier signal $R_1$ is supplied to the LF input signal N(t) by means of the adder 4, the adders 6 and 7 can be omitted. On the other hand, it is sufficient if a residual carrier signal $R_2$ is added to only one component signal, for example x, by means of the adder 6; the adders 4 and, if necessary, also 7 can then be omitted.

At its output, the adder 6 supplies a sum signal $X(t)=x(t)+R_2$ which is supplied to a first input of an amplitude computer 8. At its output, the adder 7 supplies a sum signal $Y(t)=y(t)+R_3$ which is supplied to a second input of the amplitude computer 8. In the amplitude computer 8, the input signals X(t) and Y(t) are squared, these squares are added and from the sum of the squares the root is extracted so that at an output 9 of the amplitude computer 8 and simultaneously at an output of the single-sideband modulator 1, a modulator amplitude signal $Z(t)=\sqrt{X^2(t)+Y^2(t)}$ is available which has no phase component.

In addition, the sum signal X is connected, on the one hand, directly to a switching contact 13 of a cyclic switch 16 and, on the other hand, via an inverter 10 to a switching contact 15 of the cyclic switch 16 which is offset by 180° with respect to the switching contact 13.

The sum signal Y is also connected, on the one hand, directly to a switching contact 12 of the cyclic switch 16 and, on the other hand, via an inverter 11 to a switching contact 14 of the cyclic switch 16 which is offset by 180° with respect to the switching contact 12, the switching contact 12 being offset by 90° with respect to the switching contact 13.

The switching connection, indicated by an arrow P, of the switching contact 13 to an output 16' of the cyclic switch 16 rotates clockwise if the lower sideband is used, that is to say the output 16' is successively connected to the switching contacts 12, 15, 14, 13, 12 and so forth. If the upper sideband is used, the switching connection rotates counterclockwise successively via the switching contacts 14, 15, 12 and so forth. The frequency of rotation is equal to a clock frequency $f_T$ of 100 kHz corresponding to 4 times the angular frequency of the carrier signal having a carrier frequency $f_1$ of 25 kHz. The cyclic switch 16 is an electronic switch without rotating parts. Using this frequency of rotation, a sampling signal $n(t_i) \cdot \cos(\omega t_i \pm \phi(t_i))$ is obtained at the output 16', presupposing that no residual carrier signal $R_1$ or $R_2$ or $R_3$ has been added, the "+" sign applying to the upper and the "−" sign applying to the lower sideband.

Assuming that $R_1=0$, $R_2=0$, $R_3=0$, the following applies for the upper sideband and the switching contacts 12 ... 14:

12: $n(t_1) \cdot \cos \phi(t_1) + 0 = n(t_1) \cdot \cos \phi(t_1) + R_2 \cdot \sin(\omega t_1)$,
13: $n(t_2) \cdot \sin \phi(t_2) + R_2 = n(t_2) \cdot \sin \phi(t_2) + R_2 \cdot \sin(\omega t_2)$,
14: $-n(t_3) \cdot \cos \phi(t_3) + 0 = -n(t_3) \cdot \cos \phi(t_3) + R_2 \cdot \sin(\omega t_3)$,
15: $-n(t_4) \cdot \sin \phi(t_4) - R_2 = -n(t_4) \cdot \sin \phi(t_4) + R_2 \cdot \sin(\omega t_4) = n(t_i) \cdot \cos(\omega t_i + \phi(t_i)) + R_2 \cdot \sin(\omega t_i)$.

The above equations are quite obvious if the value 0, $\pi/2, \pi$ and $3\pi/2$ are successively substituted for $t_i$.

The sampling signal at the output of the cyclic switch 16 is supplied to a quotient-former or divider 17 as the dividend and the modulator amplitude signal Z(t) from the output of the amplitude computer 8 is supplied as the divisor. At the output of the divider 17, a quotient signal is obtained which is only phase-dependent and not amplitude-dependent $=\cos(\omega t_i + \phi(t_i))$.

The output signal of the divider 17, present discretely in time due to the cyclic switch 16, is supplied to a band-pass filter 18 at the output of which a continuous modulator phase signal 19 is available, undesirable spurious oscillations being filtered out by the band-pass filter 18. The band-pass filter 18 is designed for 75 kHz, that is to say mirrored with respect to 50 kHz (=Nyquist frequency for the carrier signal frequency of 25 kHz).

It is of importance that the single-sideband modulator forms an instantaneous radio-frequency phase signal and an instantaneous amplitude value from a low-frequency signal, in such a manner that the product of these two signals results in a single-sideband-modulated signal. The product is formed in the radio-frequency output stage, all methods known from amplitude modulation being applicable (anode modulation, grid modulation, grounded-cathode circuit, grounded-grid circuit). The modulator can be constructed using analog or digital technology. Mixed solutions simultaneously using analog and digital technology are also possible.

Figure 2:
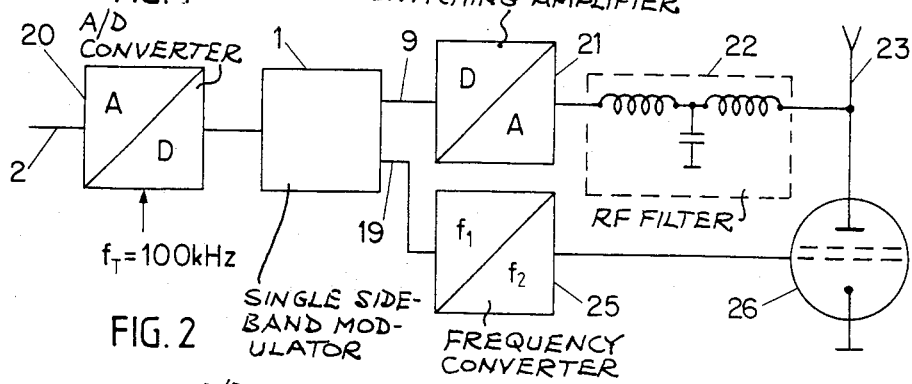
FIG. 2 shows a simplified basic diagram of a broadcast transmitter including a digital version of a single-sideband modulator according to FIG. 1.

FIG. 2 shows an application of the single-sideband modulator in a high-power broadcast transmitter, only the parts essential for the connection of the single-sideband modulator being shown for reasons of clarity.

20 designates an analog/digital converter which is clocked with the clock frequency $f_T$ of 100 kHz. The input 2 of the analog/digital converter 20 is supplied with the LF signal N and its output is connected to the input of a digitally configured single-sideband modulator 1 according to FIG. 1 to which the input signal is supplied digitally. At the outputs of the Hilbert transformer 5, a new pair of values is available every 10 μs. Since all calculations must be carried out within one sampling period of 10 μs with an accuracy of 12 bits, signal processors are used as digital components. The output of the modulator 1 is applied to switching amplifier 21, which has an output filtered by RF filter 22 and then applied to the anode 23 of the RF tetrode output stage tube 26. Modulator 1 further has its output 19 converted in frequency from $f_1$ to $f_2$ by frequency converter 25 and applied to the control grid of the tube 26.

Figure 3:
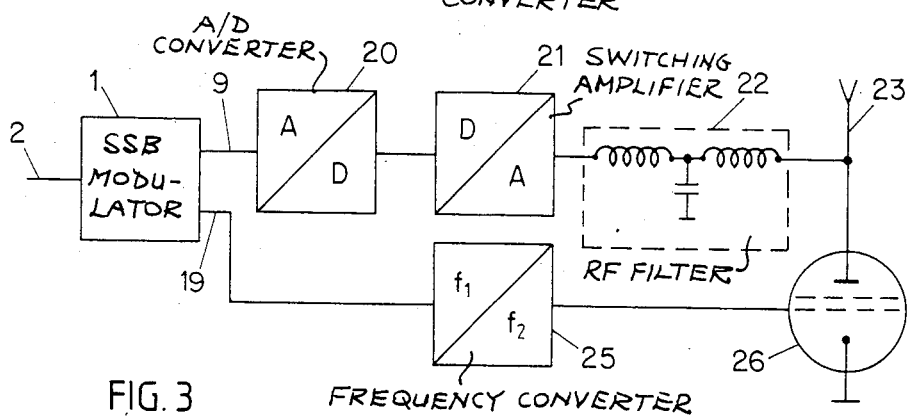
FIG. 3 shows a simplified basic diagram of a broadcast transmitter including an analog version of a single-sideband modulator according to FIG. 1.

In the embodiment of a high-power broadcast transmitter according to FIG. 3, the single-sideband modulator 1 is constructed in analog circuit technology. The input signal N and also the output signals of the single-sideband modulator 1 are analog voltages. Digitisation for the digital/analog converter 21 constructed as a switching amplifier with pulse step modulation is carried out downstream of the single-sideband modulator 1 by means of an analog/digital converter 20. The function and operation of switching amplifier 21, RF filter 22, frequency converter 25 and output stage tube 26 shown in FIG. 3 is similar to that as above described in relation to FIG. 2.

The modulator amplitude signal Z can also be applied to another grid, for example to the screen grid, of the tube instead of to the anode 23 of the RF output stage tube. The modulator phase signal 19 can also be connected to drive the cathode instead of the control grid of the RF output stage tube 26. The band-pass filter can also be integrated into the frequency converter 25 instead of in the single-sideband modulator 1. Finally, the divider 17 in the single-sideband modulator 1 can be omitted, in which case the sampling signal used for the phase modulation displays an amplitude component.

I claim:

1. Single-sideband modulation method, comprising the steps of:
   (a) deriving m component signals phase-shifted by 360°/m from a modulating input signal, where m>2 and is an integral number;
   (b) vectorially adding the component signals to form a sum vector having a value which represents a modulator amplitude signal; and
   (c) cyclically sampling all m component signals with a clock frequency which is an integral amplitude of a carrier frequency to produce a sampling signal used for phase modulation.

2. Single-sideband modulation method according to claim 1, further comprising the steps of:
   (a) dividing the sampling signal by the modulator amplitude signal to obtain a quotient signal, and
   (b) subjecting the quotient signal to band-pass filtering to produce a modulator phase signal for phase modulation.

3. Single-sideband modulation method according to claim 1 or 2, wherein a constant residual carrier signal is added to one of the modulating input signal, and at least one of the component signals.

4. Single-sideband modulation method according to one of claim 1 or 2, wherein m=2 and the clock frequency ($f_T$) is equal to 4 times the carrier frequency ($\omega$).

5. Single-sideband modulation method according to one of claim 1 or 2, wherein the modulating input signal (N) is sampled with a multiple of the carrier frequency ($f_1$).

6. Single-sideband modulator comprising:
   (a) a phase separator which splits a modulating input signal into several component signals having a fixed phase relationship of 360°/m with respect to each other, m>2 and being an integral number,
   (b) an amplitude computer for generating at its output a modulator amplitude signal as a function of the component signals, and
   (c) a cyclic switch having a clock frequency which is an integral multiple of a carrier frequency, the input of said switch being connected to the outputs of the phase separator and the output of said switch being a sampling signal for phase modulation.

7. Single-sideband modulator according to claim 6, further comprising:
   (a) a divider connected to the output of the cyclic switch which divides the sampling signal by the modulator amplitude signal to generate a quotient signal for phase modulation, and
   (b) a band-pass filter having an input connected to the output of the divider and having the modulator phase signal output.

8. Single-sideband modulator according to one of claims 6 or 7, wherein the clock frequency ($f_T$) of the cyclic switch (16) is equal to 4 times the carrier frequency ($f_1$).

9. Single-sideband modulator according to one of claims 6 or 7, wherein the phase separator is connected at its input via an adder, on the one hand, to the modulating input signal and, on the other hand, to a residual-carrier signal.

10. A single-sideband modulator according to one of claims 6 or 7, wherein:
    (a) the single-sideband modulator is of digital construction,
    (b) the single-sideband modulator is connected via an analog/digital converter to the modulating input signal, the analog/digital converter being clocked with a multiple of the carrier frequency,
    (c) the modulator amplitude signal of the single-sideband modulator is connected via a digital/analog converter and a subsequent radio-frequency filter to the anode of an output stage tube of a broadcast transmitter,
    (d) the output modulator phase signal of the single-sideband modulator is connected, via a frequency converter to a control grid of the output stage tube, and
    (e) the digital/analog converter is a switching amplifier having several switching stages which can be connected or disconnected.

11. A single-sideband modulator according to one of claims 6 or 7, wherein:
    (a) the modulator amplitude signal of the single-sideband modulator is connected via an analog/digital converter, a digital/analog converter following the analog/digital converter, and a subsequent RF filter to the anode of an output stage tube of a broadcast transmitter, and
    (b) the digital/analog converter is a switching amplifier having several switching stages which can be connected and disconnected.

12. Single-sideband modulator according to one of claims 6 or 7, wherein the phase separator is connected at its output via at least one adder for at least one component signal to the amplitude computer, the input of this adder being supplied with a residual-carrier signal and one component signal.

* * * * *